(12) United States Patent
Seyedzadehdelcheh et al.

(10) Patent No.: US 10,944,422 B1
(45) Date of Patent: Mar. 9, 2021

(54) ENTROPY AGNOSTIC DATA ENCODING AND DECODING

(71) Applicant: ADVANCED MICRO DEVICES, INC., Santa Clara, CA (US)

(72) Inventors: Seyedmohammad Seyedzadehdelcheh, Bellevue, WA (US); Shomit N. Das, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 44 days.

(21) Appl. No.: 16/579,047

(22) Filed: Sep. 23, 2019

(51) Int. Cl.
*H03M 7/30* (2006.01)
*G06F 17/16* (2006.01)
*G06F 40/151* (2020.01)

(52) U.S. Cl.
CPC .......... *H03M 7/6011* (2013.01); *G06F 17/16* (2013.01); *G06F 40/151* (2020.01); *H03M 7/3082* (2013.01)

(58) Field of Classification Search
CPC . H03M 7/6011; H03M 7/3082; G06F 40/151; G06F 17/16
USPC ..................................................... 341/50, 58
See application file for complete search history.

(56) References Cited

U.S. PATENT DOCUMENTS 8,260,992 B2 * 9/2012 Dearth ................ G06F 13/4234 710/117
8,909,840 B2 * 12/2014 Nygren ............... G06F 13/4273 710/305

OTHER PUBLICATIONS

Zhang et al, *Odd/Even Bus Invert with Two-Phase Transfer for Buses with Coupling*, Proceedings of the 2002 International Symposium on Low Power Electronics and Design (ISPLED'02), Aug. 2002, pp. 80-83, ACM New York, NY, USA.

Sotiriadis et al. *Low Power Bus Coding Techniques Considering Inter-Wire Capacitance*, Proceedings of the IEEE 2000 Custom Integrated Circuits Conference (CICC'00), May 2000, pp. 507-510, IEEE Xplore Digital Library online (IEEE.org), DOI: 10.1109/CICC.2000.852719.

Jacobvitz et al., *Coset Coding to Extend the Lifetime of Non-Volatile Memory*, Proceedings of the IEEE 19th International Symposium on High Performance Computer Architecture (HPCA'13), Feb. 2013, 2 pages, IEEE Xplore Digital Library online (IEEE.org), DOI: 10.1109/HPCA.2013.6522321.

Seyedzadeh et al., *Improving Bit Flip Reduction for Biased and Random Data*, IEEE Transactions on Computers, vol. 65, Issue 11, Nov. 2016, 13 pages, IEEE Xplore Digital Library online (IEEE.org), DOI: 10.1109/TC.2016.2525982.

O'Connor et al., *Fine-Grained DRAM: Energy-Efficient DRAM for Extreme Bandwidth Systems*, Proceedings of the 50th Annual IEEE/ACM International Symposium on Microarchitecture (MICRO-50'17), Oct. 2017, 14 pages, ACM New York, NY, USA.

(Continued)

*Primary Examiner* — Khai M Nguyen

(57) ABSTRACT

Entropy agnostic data encoding includes: receiving, by an encoder, input data including a bit string; generating a plurality of candidate codewords, including encoding the input data bit string with a plurality of binary vectors, wherein the plurality of binary vectors includes a set of deterministic biased binary vectors and a set of random binary vectors; selecting, in dependence upon a predefined criteria, one of the plurality of candidate codewords; and transmitting the selected candidate codeword to a decoder.

20 Claims, 6 Drawing Sheets

(56) References Cited

OTHER PUBLICATIONS

Lucas et al., *DOE Advanced Scientific Computing Advisory Subcommittee (ASCAC) Report: Top Ten Exascale Research Challenges*, Feb. 2014, 86 pages, U.S. Department of Energy Office of Scientific and Technical Information (online), URL: www.osti.gov/servlets/purl/1222713.
Chang et al., *Explicit Constructions of Memoryless Crosstalk Avoidance Codes via C-transform*, semanticscholar.org (online), 2013 (month unknown), 5 pages, URL: www.semanticscholar.org/paper/Explicit-Constructions-of-Memoryless-Crosstalk-via-Chang-Cheng/80079281d73e0e7e2414eccee2296b898a2a69ee.
Lee et al., *Reducing Data Transfer Energy by Exploiting Similarity within a Data Transaction*, Proceedings of the 2018 IEEE International Symposium on High Performance Computer Architecture (HPCA'18), Feb. 2018, 12 pages, IEEE Xplore Digital Library online (IEEE.org), DOI: 10.1109/HPCA.2018.00014.
Lee et al., *Design-Induced Latency Variation in Modern DRAM Chips: Characterization, Analysis, and Latency Reduction Mechanisms*, Proceedings of the ACM on Measurement and Analysis of Computing Systems (POMACS), vol. 1, Issue 1, Jun. 2017, Article No. 26, 36 pages, ACM New York, NY, USA.
Rivest, *The invertibility of the XOR of rotations of a binary word*, International Journal of Computer Mathematics, vol. 88, Issue 2, Nov. 2011, pp. 281-284, Taylor & Francis Online, DOI:10.1080/00207161003596708.

\* cited by examiner

ENTROPY AGNOSTIC DATA ENCODING AND DECODING

STATEMENT REGARDING FEDERALLY SPONSORED RESEARCH OR DEVELOPMENT

This invention was made with Government support under PathForward Project with Lawrence Livermore National Security (Prime Contract No. DE-AC52-07NA27344, Subcontract No. B620717) awarded by DOE. The Government has certain rights in this invention.

BACKGROUND

Data movement between processing units and memory accounts for a large portion of the memory access energy consumed in computer systems. The energy consumption is correlated to either costly (that is, energy consuming) symbols or symbol transitions as a result of transferring data from one side to another side of the memory system. For systems using DDR4 ('Double Data Rate Four') RAM, for example, the transmission of 0s through the I/O (input/output) interfaces is much more energy consuming than the transmission of 1s. As another example, for systems utilizing LPDDR4, the transmission of is through the I/O interfaces is more energy consuming than the transmission of 0s. In High Bandwidth Memory (HBM) systems, switching the capacitances on the data path is a primary contributor of data movement energy consumption. Many schemes have been designed to take advantage of the asymmetric patterns of 0s and 1s to reduce the transmission energy. However, when the randomness of data patterns is high (for example in floating-point benchmarks or compressed data blocks), the high entropy effectively negates the benefit provided by the existing encoding techniques that depend on asymmetric polarity distribution.

DETAILED DESCRIPTION

Figure 1:
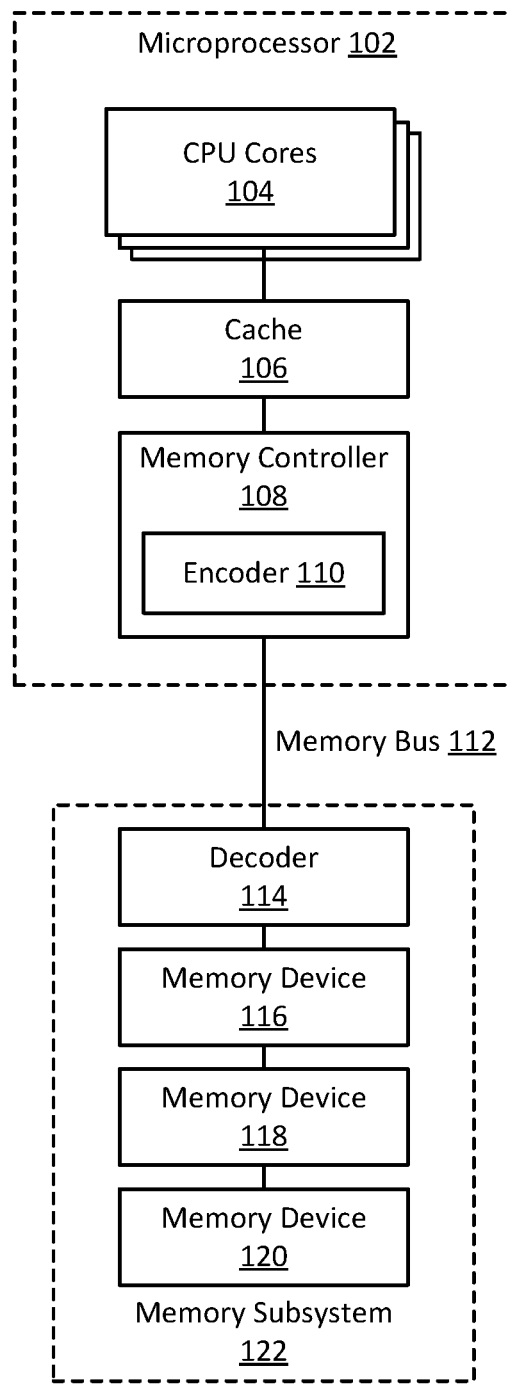
FIG. 1 sets forth a block diagram of an example system implementing entropy agnostic data encoding and decoding according to embodiments of the present disclosure.

Example methods, apparatus, and products for entropy agnostic data encoding and decoding are described in this specification. As described below in greater detail with respect to the figures, such entropy agnostic data encoding may include receiving, by an encoder, input data in the form of a bit string. The encoder generates a number of candidate codewords by encoding the input data bit string with a number of binary vectors. The binary vectors include both a set of deterministic biased binary vectors and a set of random binary vectors. The encoder selects, in dependence a predefined criteria, one of the plurality of candidate codewords. In some embodiments, the encoder performs such a selection by selecting, from the candidate codewords, the candidate codeword that most closely meets a predefined objective. The encoder then transmits the selected candidate codeword to a decoder. The predefined objective may be a variety of different things. That is, selecting the candidate codeword may be carried out by selecting the candidate codeword that reduces bit transitions relative to previously stored data, selecting the candidate codeword that reduces transmission of logic high bits, selecting the candidate codeword that reduces transmission of logic low bits, or selecting the candidate codeword that reduces transitions on a single bus wire relative to another physically proximate wire of a data transmission link.

In some embodiments, the binary vectors are generated by the encoder. The random binary vectors are generated based on the input data bit string through use of circular shift and exclusive OR (XOR) operations. More specifically, the encoder generates, for the random binary vectors, invertible base vectors by, for each of a plurality of sets including an odd number of prime numbers: producing, for each prime number in the set, an intermediate vector by shifting the input data bit string by a number of bits equal to the prime number; and producing an invertible base vector by performing a bitwise exclusive-or operation with the intermediate vectors. In some embodiments, prior to generating the invertible base vectors, the encoder transforms the input data by performing an exclusive-or operation with the input data and a static, predefined random bit pattern—thus increasing the randomness of the bit string before encoding.

The encoder also divides each invertible base vector into a predefined number of sub-vectors, determines whether to invert each sub-vector; and sets, in an auxiliary bit string associated with the invertible base vector, a flag for each inverted sub-vector. For the set of deterministic biased binary vectors, the encoder also performs such division and inversion. For example, the encoder divides each of a number of base biased vectors into a predefined number of sub-vectors; determines whether to invert each sub-vector; and sets, in an auxiliary bit string associated with the base biased vector, a flag for each inverted sub-vector.

The encoder transmits the selected codeword along with the auxiliary bit string, and an index for decoder candidate codewords. The decoder decodes the selected candidate codeword based upon binary vectors that include both a set of deterministic biased binary vectors and a set of random binary vectors. The binary vectors of the decoder match the binary vectors of the encoder.

For further explanation, FIG. 1 sets forth a block diagram of an example system implementing entropy agnostic data encoding and decoding according to embodiments of the present disclosure. The system of FIG. 1 includes a microprocessor (102) coupled through a memory bus (112) to a memory subsystem (122). The microprocessor (102) includes a number of CPU (Central Processing Unit') cores (104), a cache (106) and a memory controller (108). The memory controller in the example of FIG. 1, includes an entropy agnostic data encoder (110) configured according to embodiments of the present disclosure.

The term 'entropy' as used here refers to the randomness of the pattern of a bit string. The encoder in the example of FIG. 1 is said to be 'agnostic' of entropy in that the encoder is optimized in such a manner as to reduce energy consumption of transmission of data regardless of whether the data is random or biased. The term 'biased' as used in this specification describes a less random, more deterministic pattern of a string of bits. A pattern of 00001111 for example is a biased bit string, while a more random bit string is 01100101. Random bit strings are often produced as part of floating-point operations, benchmark applications and the like. Encoding schemes of the prior art are optimized either for random bit string patterns or biased bit string patterns, but not both random and biased. The example encoder (110) of FIG. 1 is agnostic with regard to random or biased bit string patterns.

In the example of FIG. 1, the encoder (110) is implemented as a component of the memory controller (108). The encoder may be implemented on-die. Readers of skill in the art will recognize that the entropy agnostic encoder of the present disclosure may be implemented in a variety of different manners and as part of different components. While the encoder (110) of FIG. 1 is included in a microprocessor (102), other implementations include I/O controllers, GPUs, bus controllers, and the like. In fact, an entropy agnostic encoder in accordance with embodiments of the present disclosure may be implemented in any system in which data transmission is carried out.

The encoder (110) of FIG. 1 encodes input data from a line of the cache (106) and transmits the encoded data over the memory bus (112) to the memory subsystem. The memory subsystem (122) includes a decoder (114) to decode the data received from the memory controller (108) and the encoder (110). The memory subsystem (122) also includes a number of memory devices (116, 118, 120) on which the decoded data may be stored.

Figure 2:
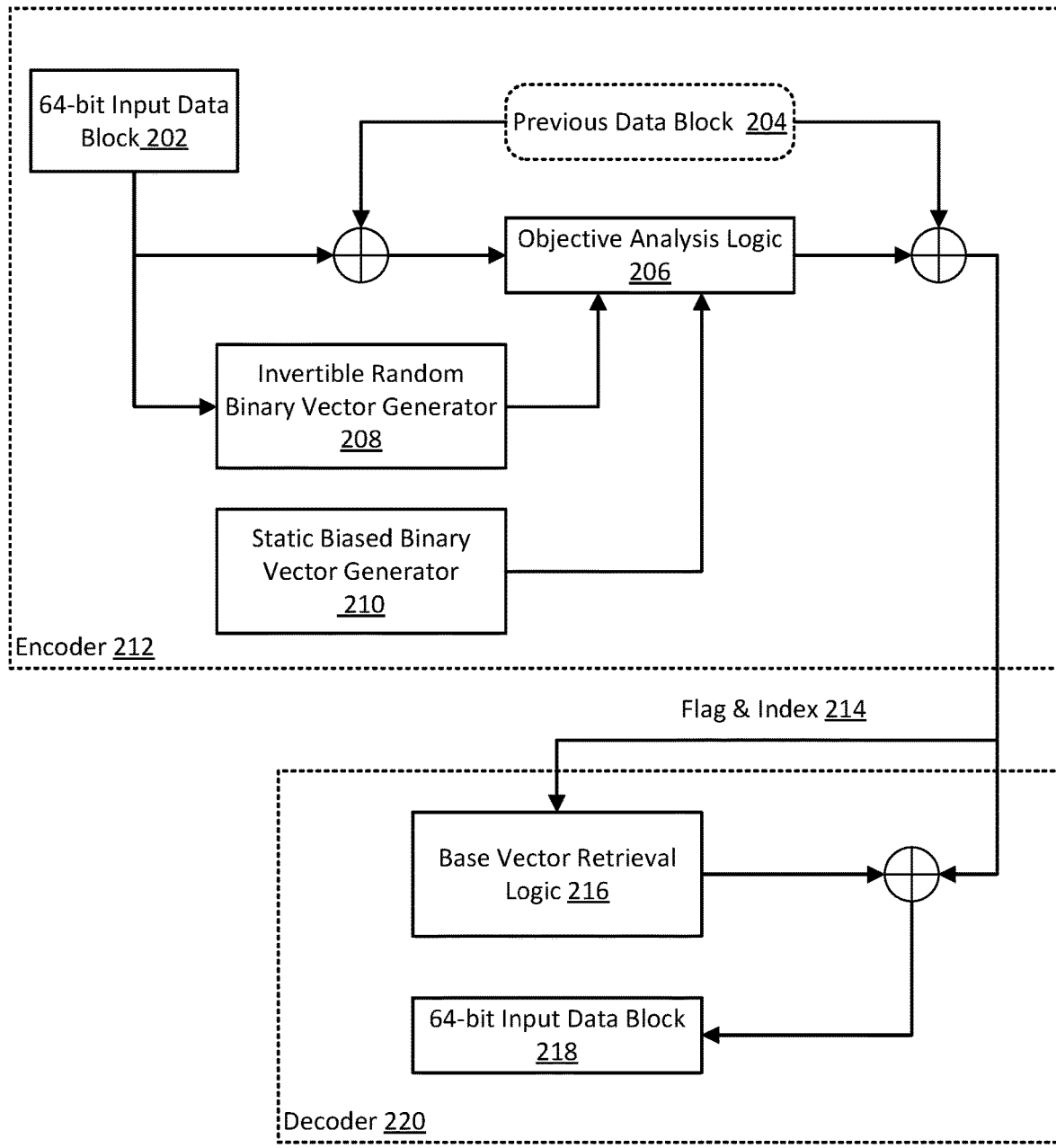
FIG. 2 sets forth a functional block diagram of an example entropy agnostic data encoder and decoder in accordance with embodiments of the present disclosure.

For further explanation, FIG. 2 sets forth a functional block diagram of an example entropy agnostic data encoder and decoder in accordance with embodiments of the present disclosure. The example encoder (212) of FIG. 2 includes an invertible random binary vector generator (208). The random binary vector generator (208) of FIG. 2 includes logic to receive an input data block (202)—in this example a 64-bit data block—and generate a predefined number of invertible vectors based on the input data block. The process for generating the invertible vectors is described in greater detail with regard to FIG. 5 below. In this example, the random binary vector generator (208) produces 12, 64-bit invertible random binary vectors.

The encoder (212) also includes a static biased binary vector generator (210). The generator (210) includes logic to produce a predefined number of deterministic binary vectors in accordance with one or more encoding schemes. Example encoding techniques optimized for biased data patterns include Data Bus Inversion ('DBI') and Transition Pattern Coding ('TPC'). In the example of FIG. 2, the biased binary vector generator (210) produces four, DBI-based bit patterns that are 64 bits in length. Examples of such DBI-based bit patterns include 0 . . . 00 . . . 00, 0 . . . 01 . . . 1, 1 . . . 10 . . . 0, and 1 . . . 11 . . . 1.

The example encoder (212) of FIG. 2 also includes objective analysis logic (206). The objective analysis logic (206) minimizes energy consumption of data transmission based on one or more objectives. For example, the objective analysis logic (206) may minimize higher energy consuming symbols, energy consuming bit transitions relative to a previously stored data block, bit transitions for one wire relative to data transmitted through another wire (to reduce crosstalk) of a bus, and so on as will occur to readers of skill in the art.

The objective analysis logic performs a bitwise exclusive-or (XOR) operation with the input data block and each of the binary vectors produced by the generators (208, 210) to create a number of candidate codewords. In the example of FIG. 2, the encoder (212) reduces energy consumption of bit transitions relative to a previously stored data block (204). In this way, the input data block is first compared to the previously stored data block through an XOR operation. Then the output of that comparison is XORed with the binary vectors produced by the generators. In embodiments in which the encoder minimizes transmission of high energy consuming symbols rather than reducing the bit transitions relative to the previous data block, the XOR of the previous data block and the input data block may be removed from the implementation.

The objective analysis logic (206) subdivides each of the codewords into a predefined number of sub-vectors. In the example of FIG. 2, each of the 16, 64-bit codewords may be subdivided into 4 sub-vectors of equal bit length. Each sub-vector is analyzed to determine whether to invert the bits of sub-vector. For example, in an embodiment in which the encoder reduces the transmission of high energy consuming 1s, the objective analysis logic may determine that any sub-vector of 16 bits that includes more than eight is should be inverted. For each sub-vector of a codeword that is inverted, the objective analysis logic (206) sets a flag. Consider, for example, that each 64-bit codeword is subdivided into four 16-bit sub-vectors. For such an embodiment, each codeword is associated with a 4-bit flag vector, where each bit corresponds to one of the codeword's sub-vectors. Setting a flag for the first and third sub-vector may result in a 4-bit flag pattern of 1010. This auxiliary flag information is transmitted along with the codeword (as XORed by the previous data block (204) if necessary) and an index identifying the base vector utilized to encode the input data to the decoder (220).

The decoder (220) in the example of FIG. 2 includes base vector retrieval logic (216) which first subdivides the received data into the sub-vectors, determines from the flag auxiliary information (214) which sub-vectors were previously inverted by encoder (212), and re-inverts those sub-vectors. The base vector retrieval logic (216) then utilizes the index (214) to determine which base vector was utilized for encoding. The corresponding base binary vector is then generated by its corresponding generator (binary or random vector generator included as part of the base vector retrieval logic (216)). The retrieved base binary vector is XORed with the transmitted codeword to retrieve the original data block (218). The decoder and encoder leverage similar logic in the base binary vector generators.

Figure 3:
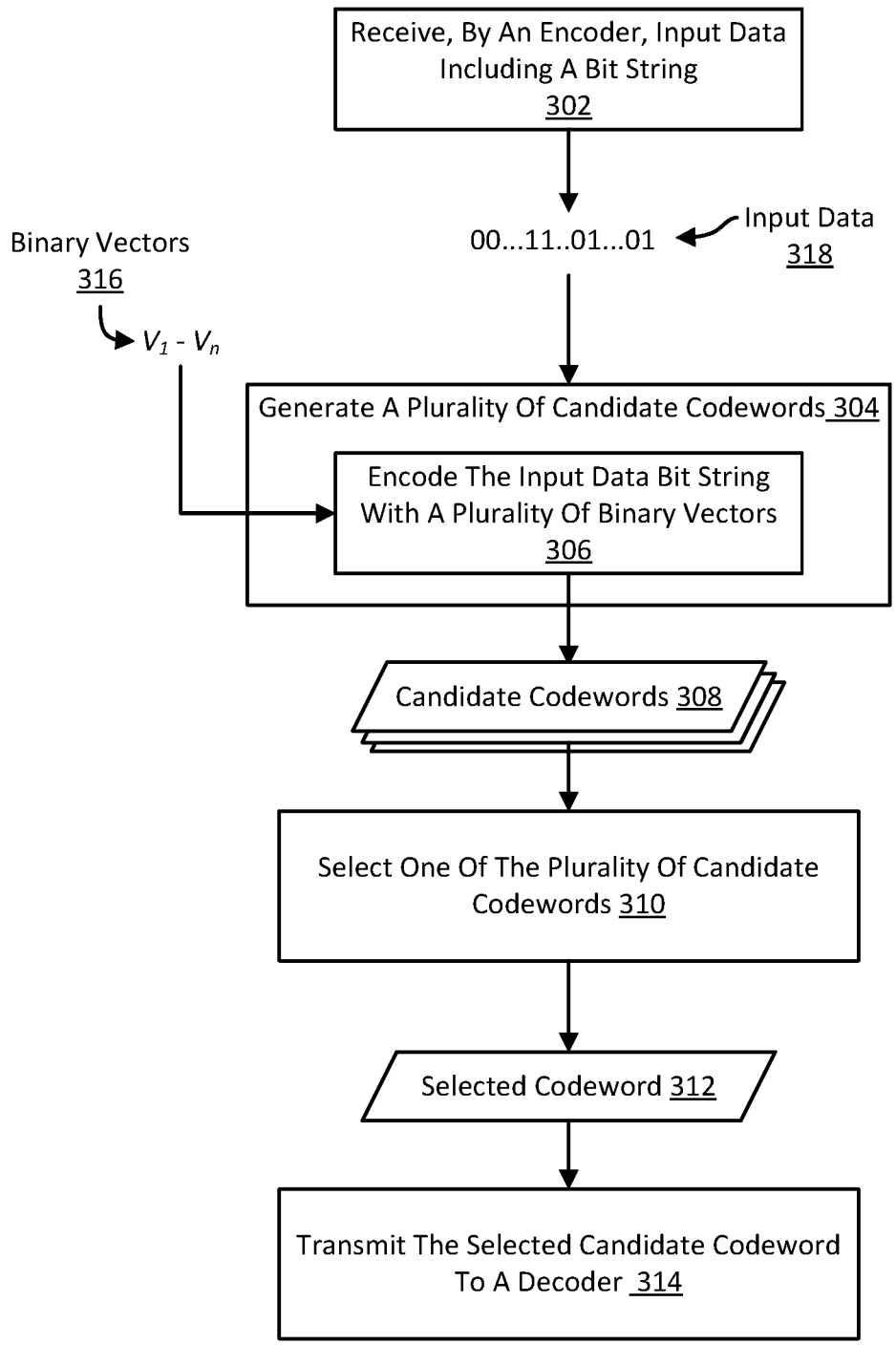
FIG. 3 sets forth a flow chart illustrating an example method of entropy agnostic data encoding in accordance with embodiments of the present disclosure.

For further explanation, FIG. 3 sets forth a flow chart illustrating an example method of entropy agnostic data encoding in accordance with embodiments of the present disclosure. The method of FIG. 3 includes receiving (302), by an encoder, input data (318). Such an encoder may be implemented in a variety of manners including those set forth in the above figures. In the example of FIG. 3, the input data is a bit string (318). In some embodiments, the bit string is 64 bits in length. Receiving the input data (318) is carried out by fetching the data from a cache line or other memory location.

The method of FIG. 3 also includes generating (304) a plurality of candidate codewords. Generating (304) the candidate codewords in the example of FIG. 3 is carried out by encoding (306) the input data bit string (318) with a plurality of binary vectors (316). The binary vectors include both a set of deterministic biased binary vectors and a set of random binary vectors. Encoding the input data bit string (318) with each binary vector is carried out by XORing the input data string with each binary vector, thereby producing a number of resultant vectors ('codewords') equal to the number of binary vectors (316). In an embodiment of 16 binary vectors, for example, encoding the input data bit string (318) with each of the binary vectors results in 16 resultant vectors or 'codewords'. The codewords are described here as 'candidate' codewords because only one of the codewords will eventually be selected as a basis for transmitting the data.

The method of FIG. 3 also includes selecting (310), in dependence a predefined criteria, one of the plurality of candidate codewords. Selecting one of the plurality of codewords in some embodiments includes selecting, from the plurality of candidate codewords (308), the candidate codeword that most closely meets a predefined objective. The predefined objective may take several different forms. That is, the encoder selects (310) one of the plurality of codewords in dependence upon a predefined objective. Examples of predefined objectives include reducing the transmission of logic high bits, reducing the transmission of logic low bits, reducing bit transitions relative to previously stored data, and reducing crosstalk on a data transmission link by reducing the transitions on a single bus wire relative another physically proximate wire of the data transmission link. To that end, the encoder may include counters for each codeword and sub-vector of the code that track the presence of bits that do not meet the predefined objective. Consider, as an example, that the predefined objective is to reduce transmission of logic high bits. In such an example, each 64-bit candidate codeword may have a 6-bit counter that represents the number of logic high bits in the codeword.

The method of FIG. 3 also includes transmitting (314) the selected candidate codeword (312) to a decoder. The decoder may be a component of another system such as a memory subsystem or an I/O interface, for example.

Figure 4:
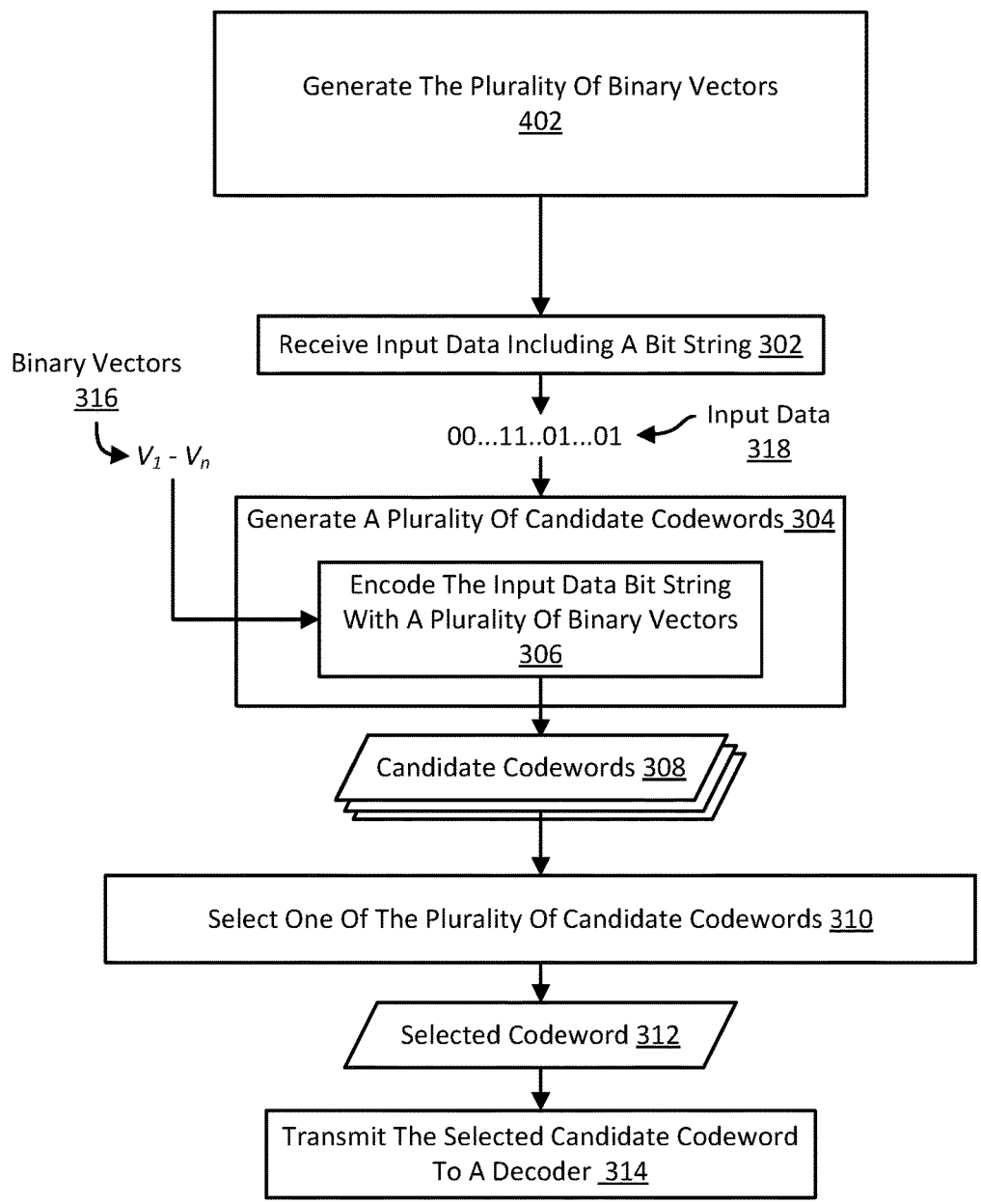
FIG. 4 sets forth a flow chart illustrating another example of entropy agnostic data encoding according to embodiments of the present disclosure.

For further explanation, the method of FIG. 4 sets forth a flow chart illustrating another example of entropy agnostic data encoding according to embodiments of the present disclosure. The method of FIG. 4 is similar to the method of FIG. 3 in that the method of FIG. 4 includes receiving (302), by an encoder, input data formed of a bit string; generating (304) a plurality of candidate codewords, including encoding (306) the input data bit string with a plurality of binary vectors, wherein the plurality of binary vectors includes a set of deterministic biased binary vectors and a set of random binary vectors; selecting (310) one of the candidate codewords; and transmitting (314) the selected candidate codeword to a decoder.

The method of FIG. 4 differs from the method of FIG. 3, however, in that the method of FIG. 4 also includes generating (402) the plurality of binary vectors. The static, deterministic biased binary vectors may be generated based on previously specified base vectors and without regard to the input data as explained below in FIG. 4. The random vectors, however, may be generated based on the input data utilizing the XOR of an odd number of rotation versions of the input data (explained below in greater detail). In such a manner, when the input data is more random than biased, the random invertible vectors are more efficient when encoding the input data. Further, although some embodiments may store a preset number of invertible vectors, the encoder can be implemented without storing any invertible random vectors and instead generating the invertible vectors from input data.

Figure 5:
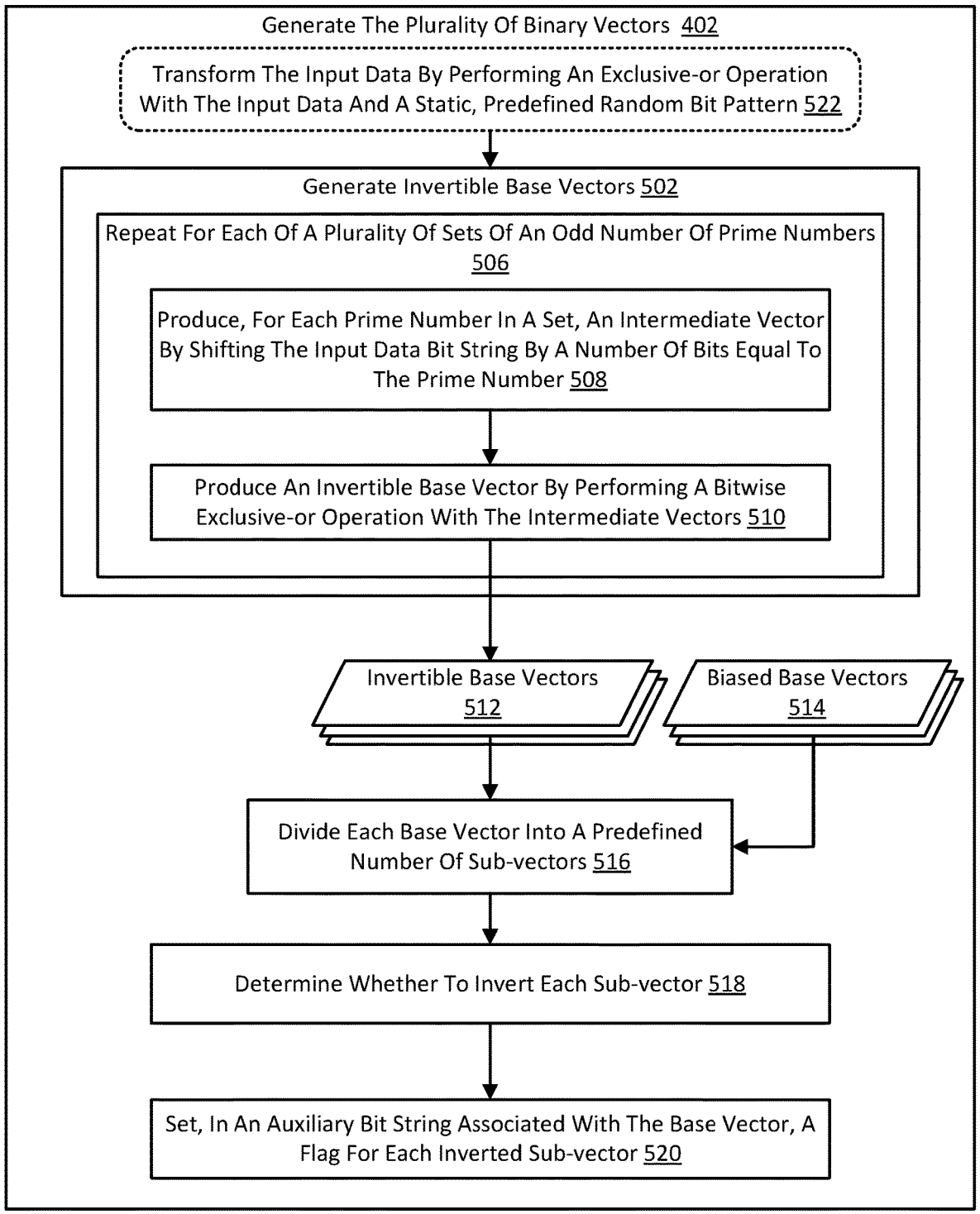
FIG. 5 sets forth a flow chart illustrating an example method of generating the binary vectors utilized in entropy agnostic data encoding according to embodiments of the present disclosure.

For further explanation, FIG. 5 sets forth a flow chart illustrating an example method of generating the binary vectors utilized in entropy agnostic data encoding according to embodiments of the present disclosure. In the method of FIG. 5, generating (402) the binary vectors is carried out in two parts, one for each type of binary vector: deterministic biased binary vector and random binary vector. With regard to the random binary vectors, the method of FIG. 5 includes generating (502) a number of invertible base vectors. Generating the invertible base vectors is carried out by, for each of a plurality of sets including an odd number of prime numbers: producing (508), for each prime number in the set, an intermediate vector by shifting the input data bit string by a number of bits equal to the prime number; and producing (510) an invertible base vector by performing a bitwise exclusive-or operation with the intermediate vectors. These two steps are repeated (506) for a number of sets of prime numbers. Described in a different way, if 'n' is a power of two, 'v' is an n-bit word, and $p_1, p_2 \ldots p_k$ are distinct fixed integers modulo 'n', then the binary vector $R(v)=(v<<<p_1) \oplus (v<<<p_2) \oplus \ldots (v<<<p_k)$ is invertible if and only if 'k' is odd, where (v<<<p) denotes that the n-bit word 'v' is rotated left by 'p' positions, and where $\oplus$ denotes the bit-wise exclusive or operation and 'p' is a primary number. The generator may utilize 'k' prime numbers between 1 and 'n' to generate one unique vector via a circular shift-XOR data operation. In some embodiments 3-tuples of prime numbers are utilized. While in this example the input bit string is shifted to the left by 'p' digits, the decoder is configured such that the bit string is shifted to the right by the same number of 'p' digits when performing decoding.

In the example of FIG. 5, the input data bit string is also transformed (522) prior to the production of the invertible base vectors. That is, the method of FIG. 5 may include, prior to generating the invertible base vectors, transforming (522) the input data by performing an exclusive-or operation with the input data and a static, predefined random bit pattern. A predefined highly random bit pattern is stored in a register or other storage medium accessible or included in the encoder and XORed with the input bit string in order to increase the randomization of the initial bit string. In such embodiments, the decoder also stores the same predefined random bit pattern and utilize the pattern when decoding.

Once the invertible base vectors (512) are generated, the encoder divides (516) the invertible base vectors along with biased base vectors (514) in a predefined number of sub-vectors. The biased base vectors may be predefined and need not be generated based on the input data. Instead, the biased base vectors may be DBI or TCP-based vectors utilized for encoding biased bit strings rather than more random bit strings. For a 64-bit input string, the encoder divides the base vectors into four equal, 16-bit sub-vectors.

The method of FIG. 5 continues by, determining (518) whether to invert each sub-vector. Determining (518) whether to invert each sub-vector is carried out by counting the number of bits within the sub-vector that results in a high energy consuming transmission rather than a low energy consuming transmission. If the count is greater than half of the length of sub-vector, the sub-vector is inverted so as to reduce the number of costly symbols or transitions.

The method of FIG. 5 also includes setting (520), in an auxiliary bit string associated with each base vector, a flag for each inverted sub-vector. Each bit in the auxiliary bit string is associated with one of the sub-vectors of a base vector and indicates whether that vector was inverted. A 4-bit auxiliary bit string of all 1s for example indicates that all four sub-vectors of a base vector have been inverted.

Figure 6:
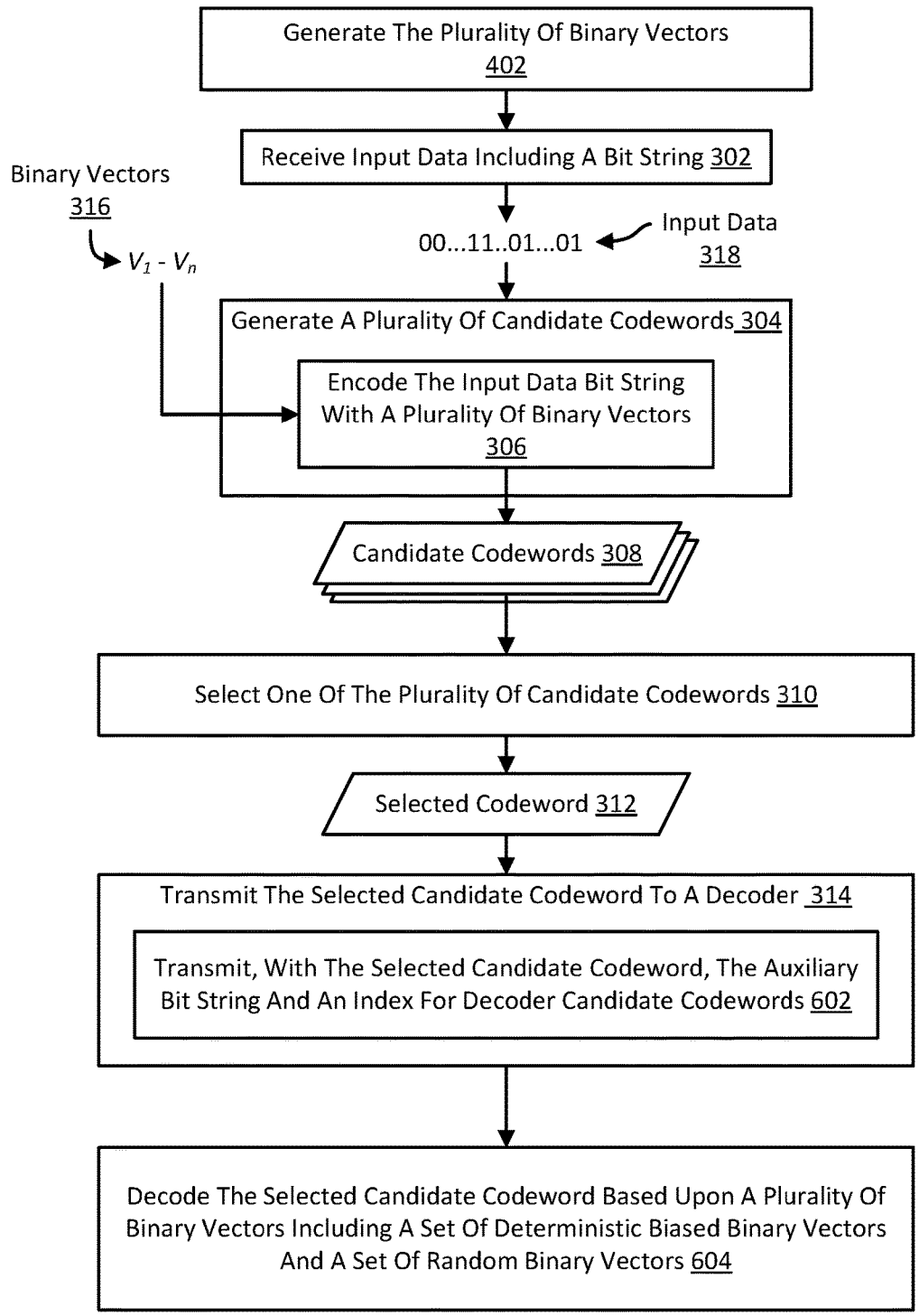
FIG. 6 sets forth a flow chart illustrating a further example of entropy agnostic encoding and decoding according to embodiments of the present disclosure.

For further explanation, the method of FIG. 6 sets forth a flow chart illustrating a further example of entropy agnostic encoding and decoding according to embodiments of the present disclosure. The method of FIG. 6 is similar to the method of FIG. 4 in that the method of FIG. 6 includes generating (402) a plurality of binary vectors; receiving (302), by an encoder, input data formed of a bit string; generating (304) a plurality of candidate codewords, including encoding (306) the input data bit string with a plurality of binary vectors, wherein the plurality of binary vectors includes a set of deterministic biased binary vectors and a set of random binary vectors; selecting (310) one of the candidate codewords; and transmitting (314) the selected candidate codeword to a decoder.

The method of FIG. 6 differs from the method of FIG. 4, however, in that in the method of FIG. 6 transmitting (314) the selected candidate codeword to a decoder includes transmitting (602), with the selected candidate codeword, the auxiliary bit string and an index for decoder candidate codewords. The auxiliary bit string, described above with respect to FIG. 5, represents a set of flags that indicate, for each sub-vector of the selected candidate codeword, whether the sub-vector was previously inverted. The index as the term is used here refers to a value that represents a pointer to the base binary vector (whether random or biased) that was utilized to generate the selected candidate codeword.

To that end, the method of FIG. 6 also includes decoding (604) the selected candidate codeword based upon a plurality of binary vectors. The plurality of binary vectors is generated by the decoder which includes the same or similar logic to the encoder for generating base binary vectors (both invertible random binary vectors and static deterministic vectors). The decoder utilizes the index to identify the base binary vector (whether random or biased) that was utilized to generate the selected candidate codeword and generate the same. If a random based binary vector was utilized by the encoder, the decoder shifts the codeword in the opposite direction than the encoder, and otherwise performs the same rotating shift XOR operation described in FIG. 5 to generate the base vector. The base vector and the candidate vector are then XORed to retrieve the original input data string.

Embodiments can include a system, a method, and/or a computer program product. The computer program product may include a computer readable storage medium (or media) having computer readable program instructions thereon for causing a processor to carry out aspects of the present disclosure.

Aspects of the present disclosure are described herein with reference to flowchart illustrations and/or block diagrams of methods and apparatus (systems) according to some embodiments of the disclosure. It will be understood that each block of the flowchart illustrations and/or block diagrams, and combinations of blocks in the flowchart illustrations and/or block diagrams, can be implemented in a variety of manners including in hardware, software, simulation and so on.

The flowchart and block diagrams in the Figures illustrate the architecture, functionality, and operation of possible implementations of systems and methods according to various embodiments of the present disclosure. In some implementations, the functions noted in the blocks of the flow charts may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure. The descriptions in this specification are for purposes of illustration only and are not to be construed in a limiting sense. The scope of the present disclosure is limited only by the language of the following claims.

What is claimed is:

1. A method of entropy agnostic data encoding, the method comprising:
   responsive to receiving, by an encoder, input data comprising a bit string, generating a plurality of candidate codewords, including encoding the input data bit string with a plurality of binary vectors, wherein the plurality of binary vectors comprises a set of deterministic biased binary vectors and a set of random binary vectors;
   selecting, in dependence a predefined criteria, one of the plurality of candidate codewords; and
   transmitting the selected candidate codeword to a decoder.

2. The method of claim 1, further comprising generating the plurality of binary vectors including:
   generating, for the random binary vectors, invertible base vectors including, for each of a plurality of sets comprising an odd number of prime numbers:
      producing, for each prime number in the set, an intermediate vector by shifting the input data bit string by a number of bits equal to the prime number; and
      producing an invertible base vector by performing a bitwise exclusive-or operation with the intermediate vectors.

3. The method of claim 2, further comprising:
   dividing each invertible base vector into a predefined number of sub-vectors;
   determining whether to invert each sub-vector; and
   setting, in an auxiliary bit string associated with the invertible base vector, a flag for each inverted sub-vector.

4. The method of claim 3, wherein further comprising, for the set of deterministic biased binary vectors:
   dividing each of a plurality of base biased vectors into a predefined number of sub-vectors;
   determining whether to invert each sub-vector; and
   setting, in an auxiliary bit string associated with the base biased vector, a flag for each inverted sub-vector.

5. The method of claim 2, wherein generating the plurality of binary vectors further comprises:
   prior to generating the invertible base vectors, transforming the input data by performing an exclusive-or operation with the input data and a static, predefined random bit pattern.

6. The method of claim 4 wherein transmitting the selected candidate codeword to the decoder further comprises transmitting, with the selected candidate codeword, the auxiliary bit string, and an index for decoder candidate codewords.

7. The method of claim 1 further comprising decoding the selected candidate codeword based upon a plurality of binary vectors comprising a set of deterministic biased binary vectors and a set of random binary vectors.

8. The method of claim 1, wherein selecting the candidate codeword in dependence upon the predefined criteria further comprises selecting the candidate codeword that reduces bit transitions relative to previously stored data.

9. The method of claim 1, wherein selecting the candidate codeword in dependence upon the predefined criteria further comprises selecting the candidate codeword that reduces transmission of logic high bits.

10. The method of claim 1, wherein selecting the candidate codeword in dependence upon the predefined criteria further comprises selecting the candidate codeword that reduces transmission of logic low bits.

11. The method of claim 1, wherein selecting the candidate codeword in dependence upon the predefined criteria further comprises selecting the candidate codeword that reduces transitions on a single bus wire relative to another physically proximate wire of a data transmission link.

12. An entropy agnostic encoder, the encoder comprising logic configured for:
responsive to receiving input data comprising a bit string, generating a plurality of candidate codewords, including encoding the input data bit string with a plurality of binary vectors, wherein the plurality of binary vectors comprises a set of deterministic biased binary vectors and a set of random binary vectors;
selecting, in dependence a predefined criteria, one of the plurality of candidate codewords; and
transmitting the selected candidate codeword to a decoder.

13. The encoder of claim 12, further comprising logic configured for generating the plurality of binary vectors including:
for the random binary vectors:
generating invertible base vectors including, for each of a plurality of sets comprising an odd number of prime numbers:
producing, for each prime number in the set, an intermediate vector by shifting the input data bit string by a number of bits equal to the prime number;
producing an invertible base vector by performing a bitwise exclusive-or operation with the intermediate vectors;
dividing each invertible base vector into a predefined number of sub-vectors;
determining whether to invert each sub-vector; and
setting, in an auxiliary bit string associated with the invertible base vector, a flag for each inverted sub-vector; and
for the set of deterministic biased binary vectors:
dividing each of a plurality of base biased vectors into a predefined number of sub-vectors; and
setting, in an auxiliary bit string associated with the base biased vector, a flag for each inverted sub-vector.

14. The encoder of claim 13, wherein generating the plurality of binary vectors further comprises, prior to generating the invertible base vectors, transforming the input data by performing an exclusive-or operation with the input data and a static, predefined random bit pattern.

15. The encoder of claim 13 wherein transmitting the selected candidate codeword to the decoder further comprises transmitting, with the selected candidate codeword, the auxiliary bit string and an index for decoder candidate codewords.

16. The encoder of claim 12, further comprising decoding the selected candidate codeword based upon a plurality of binary vectors comprising a set of deterministic biased binary vectors and a set of random binary vectors.

17. The encoder of claim 12, wherein selecting the candidate codeword in dependence upon the predefined criteria further comprises selecting the candidate codeword that reduces bit transitions relative to previously stored data.

18. The encoder of claim 12, wherein selecting the candidate codeword in dependence upon the predefined criteria further comprises selecting the candidate codeword that reduces transmission of logic high bits.

19. The encoder of claim 12, wherein selecting the candidate codeword in dependence upon the predefined criteria further comprises selecting the candidate codeword that reduces transmission of logic low bits.

20. The encoder of claim 12, wherein selecting the candidate codeword in dependence upon the predefined criteria further comprises selecting the candidate codeword that reduces transitions on a single bus wire relative to another physically proximate wire of a data transmission link.

* * * * *